United States Patent
Dettmann et al.

(10) Patent No.: US 7,045,254 B2
(45) Date of Patent: May 16, 2006

(54) MASK WITH PROGRAMMED DEFECTS AND METHOD FOR THE FABRICATION THEREOF

(75) Inventors: Wolfgang Dettmann, München (DE); Gunter Antesberger, München (DE); Jan Heumann, München (DE); Mario Hennig, Dresden (DE)

(73) Assignee: Infineon Technologies AG, Munich (DE)

( * ) Notice: Subject to any disclaimer, the term of this patent is extended or adjusted under 35 U.S.C. 154(b) by 147 days.

(21) Appl. No.: 10/307,800

(22) Filed: Dec. 2, 2002

(65) Prior Publication Data

US 2003/0134206 A1 Jul. 17, 2003

(30) Foreign Application Priority Data

Nov. 30, 2001 (DE) ................ 101 60 458

(51) Int. Cl.
*G03F 9/00* (2006.01)

(52) U.S. Cl. ............... 430/5; 430/22; 430/30; 430/323; 430/324

(58) Field of Classification Search .............. 430/5, 430/22, 30, 323, 324
See application file for complete search history.

(56) References Cited

U.S. PATENT DOCUMENTS

| | | | | |
|---|---|---|---|---|
| 5,085,957 A | * | 2/1992 | Hosono | 430/5 |
| 5,650,854 A | | 7/1997 | Sugawara | |
| 6,083,275 A | * | 7/2000 | Heng et al. | 716/19 |

FOREIGN PATENT DOCUMENTS

DE 196 22 037 A1 12/1996

* cited by examiner

*Primary Examiner*—Christopher G. Young
(74) *Attorney, Agent, or Firm*—Laurence A. Green; Werner H. Stemer; Ralph E. Locher

(57) ABSTRACT

A mask, and in particular a phase shift product mask, utilizes predetermined defects being produced during the fabrication thereof in the so-called "second layer" process. The defects are identified by markers in their direct vicinity. The markers are quadrangular and indicate, by virtue of their number in combination with their configuration, information about the respectively assigned defect, such as, for example, defect type, defect size, etc.

39 Claims, 8 Drawing Sheets

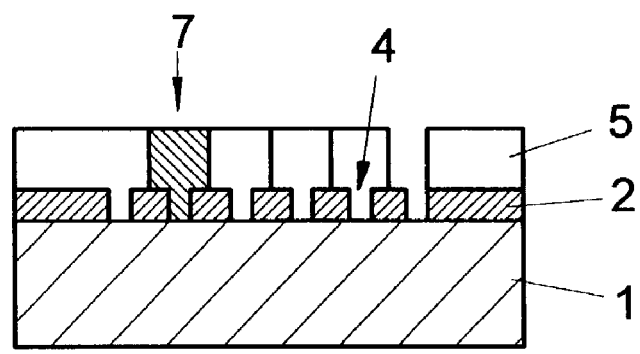
FIG 2D´
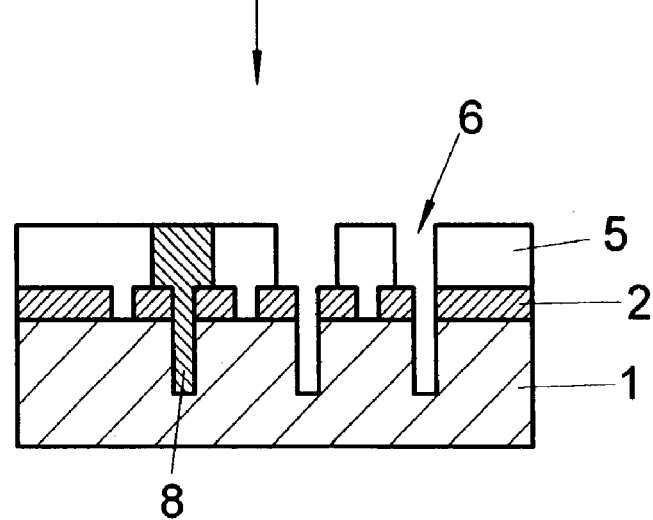
FIG 2E´

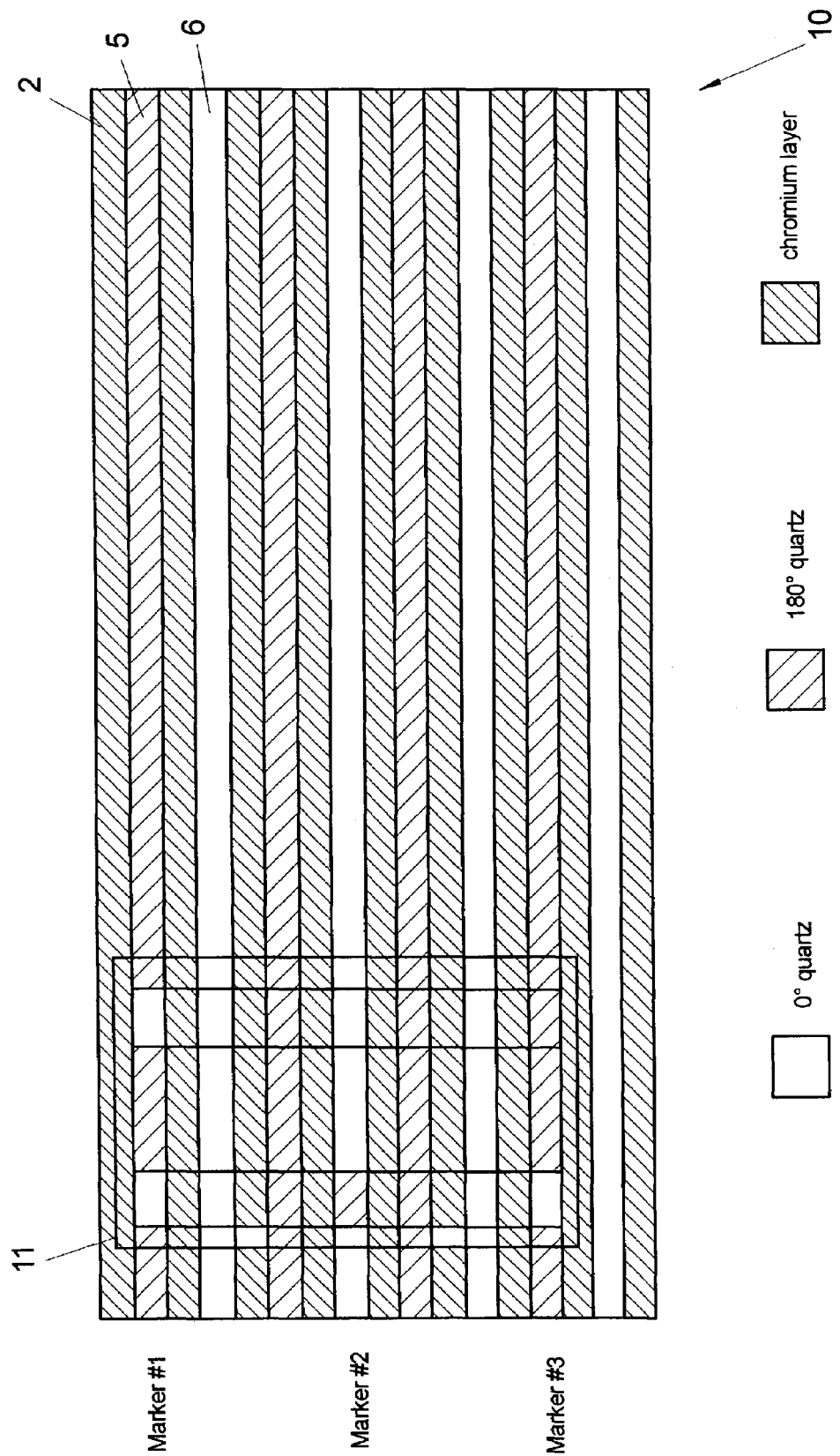

MASK WITH PROGRAMMED DEFECTS AND METHOD FOR THE FABRICATION THEREOF

BACKGROUND OF THE INVENTION

Field of the Invention

The major advances in microelectronics mean that the structures of integrated circuits become smaller and smaller and the number of elements disposed on a silicon chip, such as transistors, diodes, resistors, capacitors, and interconnects, becomes larger and larger.

In the photolithographic fabrication method, such structures are fabricated on the surface of a silicon substrate that has been coated with a light-sensitive resist. Then, the latter is exposed with the aid of a mask at the locations at which intervention is later to be made. The photoresist can be stripped easily away at the exposed locations, thereby uncovering the silicon surface for etching.

In order to ensure an accurate imaging of the structures and thus a possible miniaturization of the circuits, defects in the structures on the masks must be minimized. Therefore, the prior art teaches to use special test masks with programmed defects in order to avoid defects in the fabrication of the product masks that contain the chip structures that are actually to be fabricated (such test masks contain test structures which differ from the chip structures).

In this case, the test masks are intended to fulfill three central tasks. Firstly, they are intended to enable calibration of mask defect inspection installations. The calibration is intended to ensure that it is possible to detect all those defects that would lead to so-called "spec infringements" (i.e. infringements of the specification) during chip fabrication.

Furthermore, the test masks are intended to be used to define criteria which can be used for subsequently checking the product masks. In particular, the programmed defects on the test masks are intended to be inspected using AIMS (Aerial Image Measurement System) microscopes in order to identify them and to be able to draw conclusions therefrom as to how statements about possible mask defects can already be made prior to chip fabrication. In this case, the optical parameters of the microscopes (numerical aperture, spatial coherence) can be adapted to the stepper parameters. Consequently, the aerial image of the test mask imaging in the microscope corresponds to the aerial image of the stepper. Criteria for maximum tolerable fluctuations are then derived from the measured deviations in the aerial image in comparison with deviations at the wafer level. Such criteria defined in this way are also referred to as "defect printability criteria".

Such "defect printability criteria" are additionally intended to be taken into account for the systematic examination of defect repairs. Such repairs are carried out because it is comparatively expensive to fabricate a new (defect-free) product mask, and, on the other hand, the customer cannot tolerate critical defects on the product mask.

Prior-art test masks have programmed defects by which the requirements cannot be fulfilled simultaneously. The type and size of said defects lie within or outside the critical (i.e. tolerance) ranges, depending on the requirement.

In particular, use is made of inscriptions for marking defects that do not harmonize with the algorithms of known inspection installations. As a consequence of this, the markings themselves cause a high number of defect messages, so that the search for defects generally has to be terminated.

Moreover, it is often problematic to print test masks, whose structures differ significantly from those of product masks, onto the wafer. Furthermore, the highly complex configuration of test masks is disadvantageous; it entails a high outlay in the layout configuration.

SUMMARY OF THE INVENTION

It is accordingly an object of the invention to provide a mask with programmed defects and a method for the fabrication thereof that overcome the hereinafore-mentioned disadvantages of the heretofore-known devices and methods of this general type and that rectify the problems of the prior art.

With the foregoing and other objects in view, there is provided, in accordance with the invention, a product mask for use in the fabrication of a semiconductor structure by using lithography. The product mask includes a quartz layer and a masking layer. The masking layer runs on the quartz layer and serves for masking predetermined regions of the quartz layer for the imaging of the semiconductor structures. The mask surface has one or a plurality of predetermined defects. Each of the defects is marked by a marking on the mask surface.

"Product mask" is to be understood to be a mask that contains the semiconductor structures to be fabricated for production (or planned production). The implementation of programmed defects on a product mask has the advantage that, in addition to the "desired" defects, process-dictated ("natural") defects also arise on the mask. Consequently, it is possible to examine directly the different effects of "desired" and "natural" defects and to adjust the inspection installations to them. In an inspection step, it is then possible to adjust the sensitivity for process defects and programmed defects. The relationship with the process defects that are otherwise to be found on other masks is thus very close. Equally, a repeat test can be carried out very easily in order to ascertain the limits of the test installation.

The layout is accordingly based on an existing layout for the (planned) production, so that there is no need to create a new special test layout. Furthermore, in the fabrication of the mask, all the production steps and production parameters are identical to those steps and parameters that are also otherwise used for the fabrication of a product mask. Optimum reproducibility of programmed defects in conjunction with the production of production-dictated "genuine" defects is thus achieved.

Furthermore, the invention provides a phase shift mask for use in the fabrication of a semiconductor structure by using lithography. The phase shift mask has a quartz layer and a masking layer. The masking layer runs on the quartz layer and serves for masking predetermined regions of the quartz layer for the imaging of the semiconductor structures; and a number of trenches formed in the quartz layer. The quartz layer has one or a plurality of predetermined defects within and/or outside the trenches.

The masking layer may be formed by a chromium layer. Phase shift masks are generally distinguished by the fact that one portion of the structures is only etched into the chromium layer, while another portion of the structures is etched right into the underlying quartz layer. As an alternative, all the structures can be etched into the quartz layer with a different depth.

In particular, the etching depth is alternated for adjacent structure parts. As a result, the contrast of adjacent structures is increased during the imaging onto the substrate. This is due to the fact that the light, during the imaging of the mask structures onto the substrate, experiences a phase shift depending on the etching depth of the respective structure parts.

The fabrication process of a phase shift mask includes two process parts. In the first process part ("first layer" process), all the structures are etched into the chromium layer. In the second process part ("second layer" process), some of the structures are additionally etched into the quartz layer.

The defects and markings are advantageously implemented exclusively in the "second layer" process. As a result of this, the layout can be realized rapidly since only one plane of the layout (precisely that "second layer" in the quartz) is affected by the alterations. The quartz defects and the assigned markings can be produced in a simple manner by local coverings (quartz elevations) or exposures (quartz holes).

The individual programmed defects are identified by the marking. As a result, the defects can easily be found in particular by using AIMS and in the print test, even with inaccurate defect coordinates, and the defect type and size can be read.

Preferably, each marking includes a number of markers, each of which is assigned to a mark type, and each mark type is assigned to a predetermined defect parameter. The assignment of each marker to a mark type is effected by the configuration thereof on the mask surface. The predetermined defect parameters are formed by a defect category, a defect type, and a phase shift generated by a defect. The defect category, the defect type, and the phase shift generated by a defect is in each case determined by the number of markers of the assigned marker type. The defect category determines whether a defect has been formed by a quartz elevation within a trench or a quartz hole outside a trench or has arisen as a result of the repair of a previous defect (repair test). The defect type determines whether a defect is a side defect, a central defect, or a bridge defect.

Preferably, markers of the same type are applied on the same plane of the mask, and adjacent markers of different types are applied on different planes of the mask. "Planes" mean regions of different etching depth. Thus, by way of example, all markers of one type may lie within trenches, while all adjacent markers of another type lie outside the trenches. The marker types thus can be distinguished in a simple manner.

In an advantageous manner, the markers are substantially rectangular and of a configuration such that they can be identified without difficulty by inspection installations used, without leading to a growth in the triggered defect identifications. Consequently, the entire mask can be inspected, and not just parts of the mask in which there are no inscriptions that trigger further defect messages.

The markers may be formed by quartz elevations and/or quartz holes on or in the quartz layer. As a result, it is possible to produce the markings in the same step as the production of the defects and trenches i.e. in the "second layer" process.

The defects vary in size but are always smaller (preferably significantly smaller) than the markers. The situation where markers are confused with defects can thus be eliminated.

With the objects of the invention in view, there is also provided a method for fabricating a mask, having the following steps. The first step is fabricating a mask structure by the exposure and etching away of predetermined regions of a masking layer on a substrate. The next step is applying a photoresist to the masking structures and to unmasked regions of the substrate. The next step is exposing and etching away of predetermined regions of the photoresist, in order to uncover specific unmasked regions of the substrate. The next step is etching away of parts of the substrate in the uncovered regions in order to form trenches and in order to produce at least one defect on the substrate within or outside the trenches. The next step is removing the photoresist.

Preferably, the method additionally contains the following step: marking of each of said defects on the mask surface in the vicinity of the respective defect. Each marking constitutes machine-readable information about the assigned defect. Each marking is of a configuration such that it is imaged onto a wafer disposed underneath during the exposure of the mask during the fabrication of a semiconductor device.

The markers are positioned in direct proximity to the defects in the "die field" and can be implemented without a high outlay in the layout configuration in the same layer as the defects themselves. Furthermore, the markers are configured in such a way that they are also readily identifiable on the wafer. Complex inscription fields are thus superfluous.

Furthermore, it is possible to produce a multiplicity of identical defects. This serves for evaluating new or existing repair strategies. Comparison of defects and repaired locations allows rapid monitoring of the quality of the repair(s).

The marking can be carried out by masking out predetermined parts of the regions to be exposed, so that etching into the substrate is prevented in these partial regions.

Consequently, the markings are formed by elevations on the substrate.

As an alternative, the marking can also be carried out by etching the quartz layer, so that the markings are formed by holes in the substrate. These marking types can be advantageously combined, so that some of the markings are formed from holes in the substrate, and other markings are formed from elevations on the substrate.

Other features that are considered as characteristic for the invention are set forth in the appended claims.

Although the invention is illustrated and described herein as embodied in a mask with programmed defects and method for the fabrication thereof, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 2D' and 2E' are diagrammatic sectional views showing the steps in the production of a defect on the phase mask according to the invention;

FIG. 3 is a diagrammatic sectional view showing the marking of a defect on the phase mask according to the invention.

DESCRIPTION OF THE PREFERRED EMBODIMENTS

Referring now to the figures of the drawings in detail and first, particularly to FIG. 1 thereof, there is shown the steps in the fabrication of an alternating phase mask (PSM=Phase Shifting Mask). The phase mask includes a quartz layer 1, a chromium layer 2, and also a first photoresist layer 3 (FIG. 1A). Through exposure and subsequent development, first trenches 4 are fabricated in the chromium layer 2 (FIG. 1B), through which, during the lithography, light can fall onto a substrate lying below the mask.

Figure 1A:
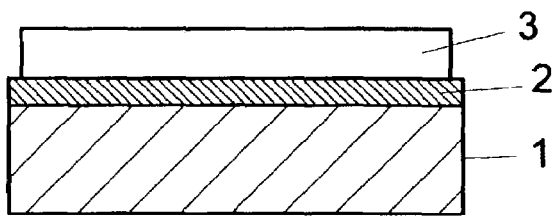
FIGS. 1A–1E are diagrammatic sectional views showing the steps in the fabrication of an alternating phase mask according to the invention.
Figure 1B:
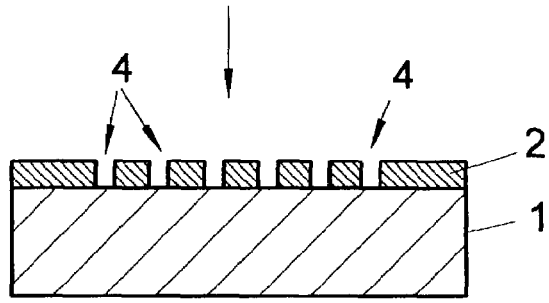
Figure 1C:
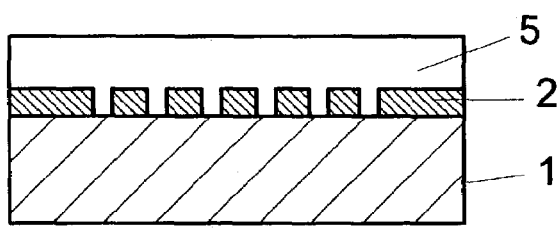
Figure 1D:
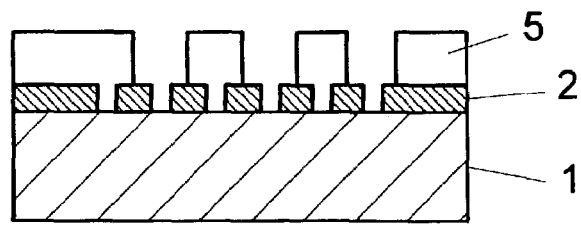
Figure 1E:
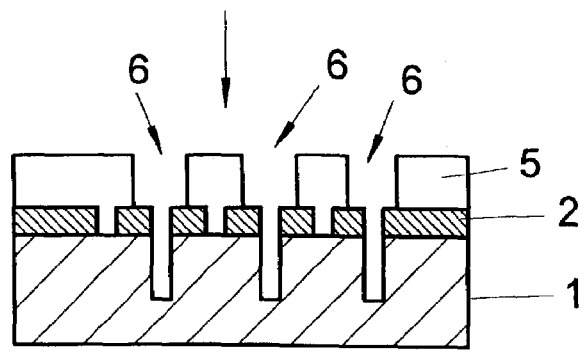

Afterward, a second photoresist layer 5 is applied to the layers 1 and 2 (FIG. 1C) and, through exposure and subsequent development second trenches 6 are fabricated in the quartz layer 1 (FIGS. 1D and E). During the exposure of a substrate by using such a mask, the light that falls through the trenches 6 is phase-shifted by 180° relative to that which falls through the trenches 4. This increases the imaging resolution on the substrate. The second photoresist layer 5 is subsequently removed.

FIG. 2 diagrammatically illustrates how a defect 8 is produced in the quartz layer 2 at the location 7 through one of the second trenches 6. The defect 8 is produced in steps E and D from FIG. 1, i.e. exclusively in the so-called "second layer" process, that is to say the production of the phase trenches (second trenches) 6. In the embodiment shown, the defect 8 is produced by covering one of the exposed regions of the photoresist 5 during etching. As a result, at a location at which a trench should actually be produced, the production thereof is prevented. Consequently, the light, at this location, does not experience a phase shift of 180° relative to the adjacent regions during exposure.

Conversely, defects can also be produced by etching into the quartz layer 1 at locations at which no trenches should be produced. As a result, light passing through at these locations is phase-shifted relative to adjacent regions, even though such a phase shift is not desired at these locations.

Defects that effect a relative phase shift of less than 180° can be produced by sparing certain regions during the "second level" exposure. After the etching of the trenches 6 and removal of the resist 5, a resist is again applied this is exposed and removed only in the spared regions. Afterward, the quartz layer 1 is etched into at these locations until the desired phase shift of light that passes through relative to adjacent locations is produced (e.g. 60° or 120°).

Figure 2A:
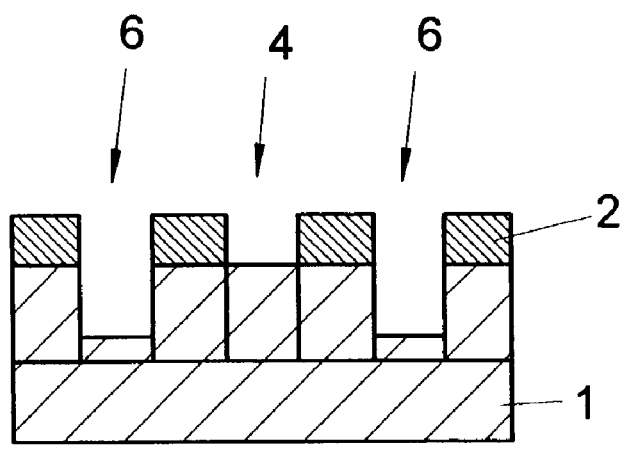
FIGS. 2A to 2C are diagrammatic sectional views showing the performance of light intensity balancing using the phase mask according to the invention.

FIGS. 2D' to 2E' diagrammatically show how the intensity of the light falling through the masks is balanced by alteration of the trenches 6. FIG. 2A illustrates an untreated mask, in the case of which the intensity of light that passes through the trenches 6 is lower than that of light which passes through the trenches 4.

A balancing possibility that is not shown is that of "chromium bias". In this case, the trenches 6 are widened by reducing the width of the chromium regions.

Figure 2B:
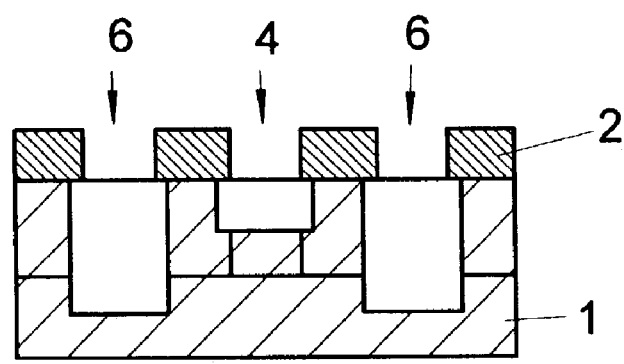
Figure 2C:
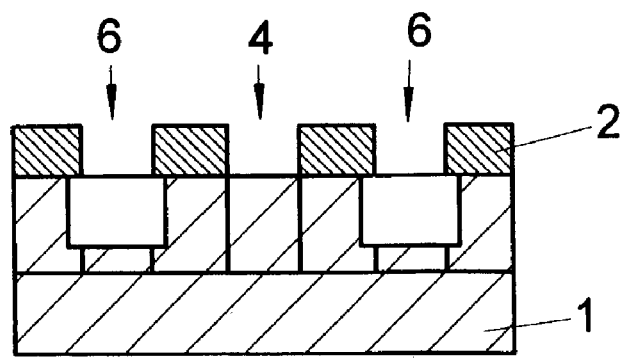

FIGS. 2B and 2C each show alternate possibilities. In FIG. 2B, on the one hand, the trenches 6 are deepened and widened by isotropic etching, so that they extend to a point below the chromium layer 2. On the other hand, the trenches 4 are likewise additionally etched into the quartz layer by isotropic etching in such a way that they also extend, as shown, to a point below the chromium layer 2.

In FIG. 2C, only the trenches 6 are widened by isotropic etching. Effects that have already been produced need not be taken into account during the intensity balancing.

Each defect is assigned a marking which represents the category, the type, and also the phase shift effected by the defect. Each marking includes three marker groups:

1) Defect category - Marker#1
   Quartz elevations - 1 Marker
   Quartz holes - 2 Markers
   Repair test - 3 Markers 2) Defect type - Marker#2
   Central defect - 1 Marker
   Side defect - 2 Markers
   Bridge defect - 3 Markers
3) Phase shift - Marker#3
   180° phase shift - 0 Markers
   60° phase shift - 1 Marker
   120° phase shift - 2 Markers The number of markers #1, #2, and #3 determines the defect category, the defect type, and the phase shift generated by the defect, respectively.

FIG. 3 diagrammatically shows the surface of a mask 10, with a marking 11 of a defect which is formed by a quartz hole, central defect type, phase shift 60°. The layers 2, 5 and 6 of the mask 10 correspond to those in FIGS. 1 and 2. As can be seen from FIG. 3, the assignment of the markers to the markers #1, #2, or #3 is effected by the configuration thereof on the mask surface.

Figure 4:
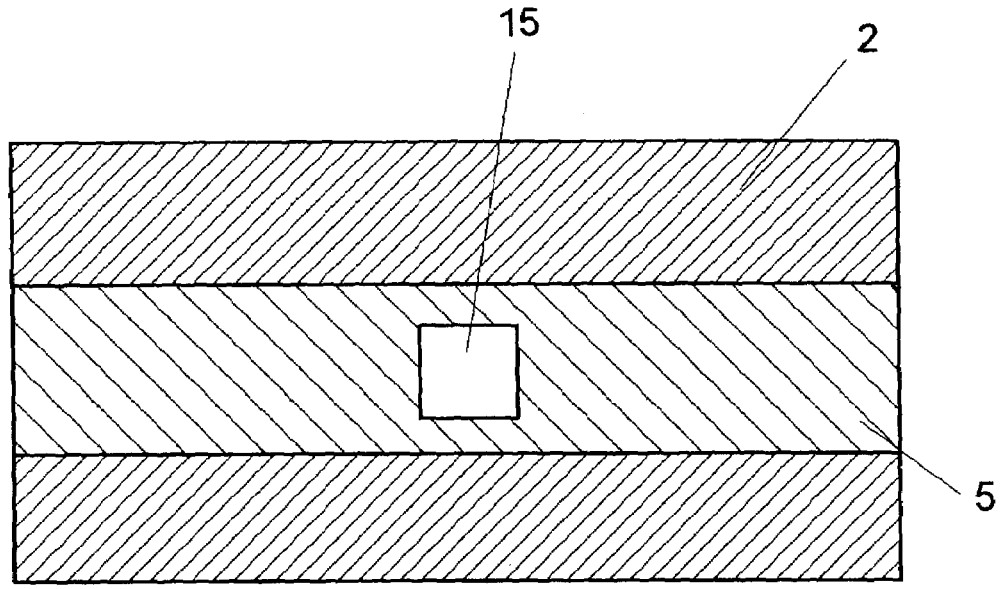
FIGS. 4–7 are sectional views showing different defects on the phase mask according to the invention.

FIG. 4 diagrammatically shows a defect 15 assigned to the marking 11 in FIG. 3 (quartz hole, central, 60°). The dimensions shown are only by way of example and can be varied as indicated.

Figure 5:
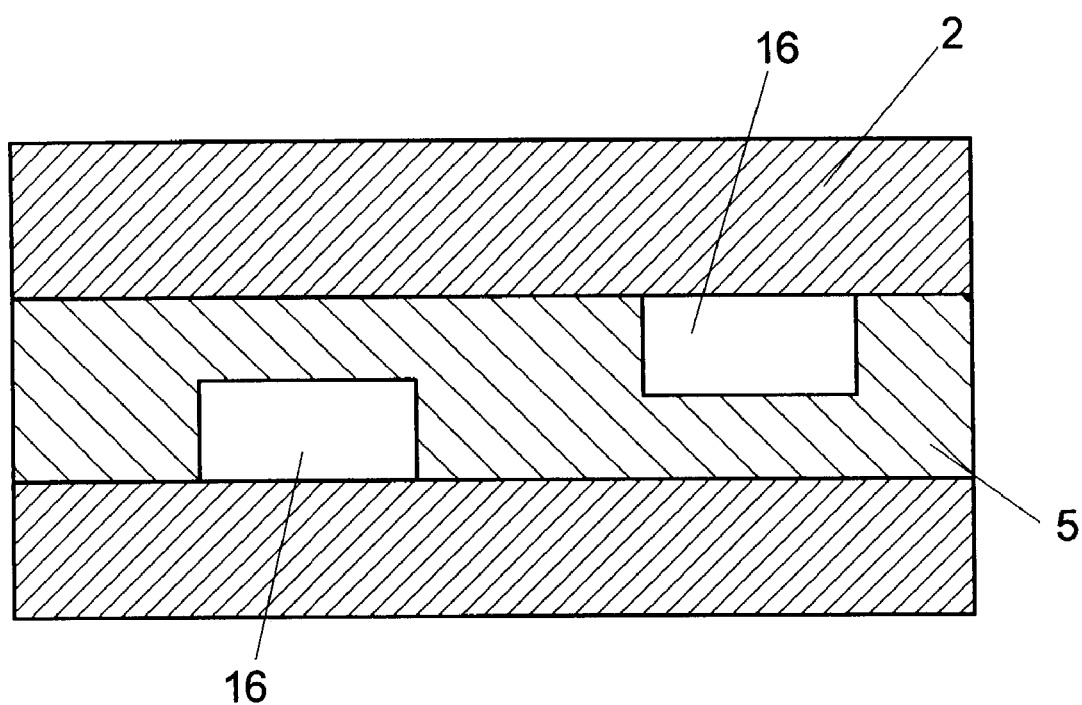
Figure 6:
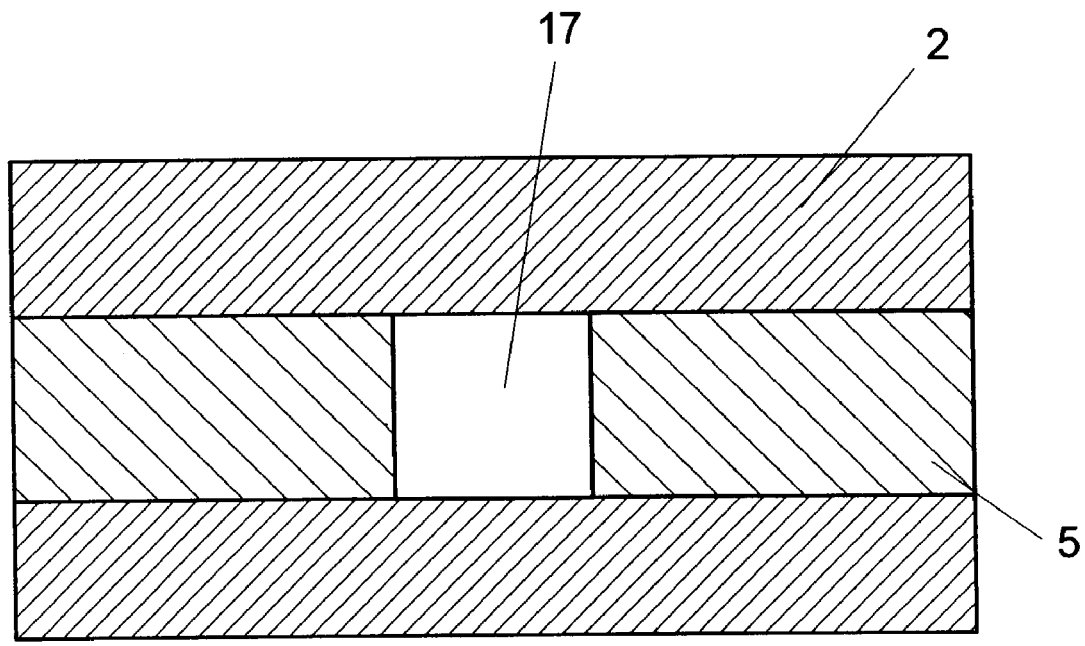
Figure 7:
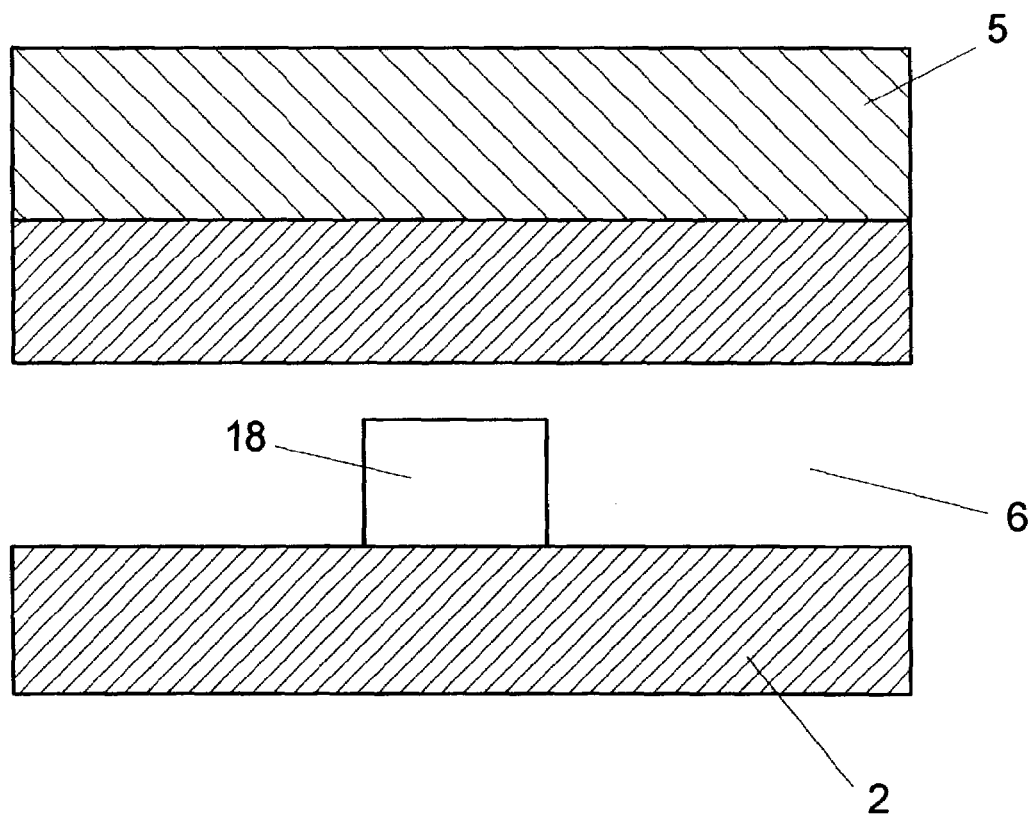

FIGS. 5 to 7 diagrammatically show further exemplary defects 16, 17 and 18, respectively. FIG. 5 shows a quartz elevation of the defect type "side defect". FIG. 6 shows a quartz elevation of the type "bridge defect". FIG. 7 shows a quartz hole of the type "side defect".

The invention is not restricted to the exemplary embodiments described, but rather encompasses modifications in the context of the scope of protection defined by the claims. In particular, the invention analogously encompasses the production and marking of "first layer", chromium defects instead of "second layer", quartz defects. The invention also encompasses halftone phase masks with corresponding "first layer" defects and the markings thereof.

We claim:

1. A product mask for fabricating a semiconductor structure with lithography, comprising:
   a quartz layer; and
   a masking layer running on said quartz layer, having a mask surface, and masking predetermined regions of said quartz layer for imaging the semiconductor structure, said mask surface having at least one of a possible plurality of predetermined and programmed defects, and each of said defects being marked by a marking on said mask surface.

2. The product mask according to claim 1, wherein said marking includes a number of markers, each of said markers being assigned to a respective mark type, and each mark type being assigned to one of said predetermined and programmed defects.

3. The product according to claim 2, wherein each of said markers is assigned to one of said mark types by a configuration of said markers on said mask surface.

4. The product mask according to claim 2, wherein parameters of each of said predetermined and programmed defects are formed by a defect category, a defect type, and a phase shift generated by each of said defects.

5. The product mask according to claim 4, wherein said defect category, said defect type, and said phase shift generated by said defect is determined in each case by said number of said markers of said assigned marker type.

6. The product mask according to claim 4, wherein said defect category determines a formation for each of said defects, said formation being one of a quartz elevation, a quartz hole, and a repair of a previous defect.

7. The product mask according to claim 4, wherein said defect type determines a type of said defect, said type being one of a side defect, a central defect, and a bridge defect.

8. The product mask according to claim 2, wherein said markers are rectangular.

9. The product mask according to claim 2, wherein each of said markers is formed by a quartz elevation.

10. The product mask according to claim 2, wherein each of said markers is formed by a quartz hole on said quartz layer.

11. The product mask according to claim 2, wherein each of said markers is formed by a quartz hole in said quartz layer.

12. A phase shift mask for fabricating semiconductor structures using lithography, comprising:
    a quartz layer having a number of trenches formed therein, each of said trenches each having a predetermined and programmed defect; and
    a masking layer running on said quartz layer and masking predetermined regions of said quartz layer for imaging the semiconductor structures.

13. The phase shift mask according to claim 12, wherein said predetermined and programmed defect is formed within one of said trenches.

14. The phase shift mask according to claim 12, wherein said predetermined and programmed defect is formed outside one of said trenches.

15. The phase shift mask according to claim 12, wherein said defect is marked by a marking on said mask surface in a vicinity of said defect.

16. The phase shift mask according to claim 15, wherein said marking includes a number of markers, each of said markers has an assignment to a mark type, and each mark type has an assignment to a predetermined defect parameter.

17. The phase shift mask according to claim 16, wherein said assignment of each marker to said mark type is produced by a configuration of said marker on said mask surface.

18. The phase shift mask according to claim 16, wherein said predetermined defect parameter is formed by a defect category, a defect type, and a phase shift generated by said defect.

19. The phase shift mask according to claim 18, wherein said defect category, said defect type, and said phase shift are generated respectively by determining said defect by a number of said markers of said assigned marker type.

20. The phase shift mask according to claim 18, wherein said defect category is determined by and is one of a defect formed by a quartz elevation within one of said trenches, a quartz hole outside one of said trenches, and results from a repair of a previous defect.

21. The phase shift mask according to claim 16, wherein said defect has a defect type selected from the group consisting of a side defect, a central defect, and a bridge defect.

22. The phase shift mask according to claim 21, wherein:
    said masking layer defines a plane; and
    all markers of one of said types lie on said plane.

23. The phase shift mask according to claim 21, wherein:
    said mask has a plurality of planes; and
    adjacent markers of different types lie on different planes of said mask.

24. The phase shift mask according to claim 16, wherein said markers are rectangular.

25. The phase shift mask according to claim 16, wherein each of said markers is formed by a quartz elevation.

26. The phase shift mask according to claim 16, wherein each of said markers is formed by a quartz hole on said quartz layer.

27. The phase shift mask according to claim 16, wherein each of said markers is formed by a quartz hole in said quartz layer.

28. A method for fabricating a mask, which comprises the steps:
    fabricating a mask structure by exposing and etching away of predetermined regions of a masking layer on a substrate, and thereby also defining unmasked regions of the substrate;
    applying a photoresist to the mask structure and to the unmasked regions of the substrate;
    exposing and etching away of predetermined regions of the photoresist to uncover specific unmasked regions of the substrate;
    etching away of parts of the substrate in the uncovered specific unmasked regions to form trenches in order to produce a programmed defect on the substrate in a vicinity of the trenches; and
    removing the photoresist.

29. The method according to claim 28, which further comprises forming the defect within one of the trenches.

30. The method according to claim 28, which further comprises forming the defect outside one of the trenches.

31. The method according to claim 28, which further comprises constituting the mask structure as semiconductor structures to be fabricated.

32. The method according to claim 28, which further comprises marking each of the defects on the mask surface in a vicinity of the respective defect, each marking including machine-readable information about the respective defect.

33. The method according to claim 32, wherein the marking step includes etching a quartz layer.

34. The method according to claim 32, wherein the marking step includes masking out predetermined parts of the regions to be exposed to prevent etching into the substrate in the predetermined parts.

35. The method according to claim 32, wherein the marking step includes a configuration imaged onto a wafer disposed underneath the mask during the exposure of the mask during the fabricating step.

36. The method according to claim 32, which further comprises producing a multiplicity of identical defects on the substrate at locations selected from the group consisting of within the trenches and outside the trenches.

37. The method according to claims 32, further comprising:
    producing two identical structure parts;
    producing a defect in a first of the structure parts;
    maintaining no defects in a second of the structure parts;
    repairing the defect in the first of the structure parts; and
    comparing the repaired first of the structure parts with the second of the structure parts.

38. The product mask according to claim 1, wherein said marking is formed in such a way that it gets imaged onto a wafer disposed underneath the mask during an exposure of said marking during the fabrication.

39. The method according to claims 32, which further comprises marking in the same step as producing the defects and trenches.

* * * * *